(12) United States Patent
Suh

(10) Patent No.: US 7,381,612 B2
(45) Date of Patent: Jun. 3, 2008

(54) METHOD FOR MANUFACTURING SEMICONDUCTOR DEVICE WITH RECESS CHANNELS AND ASYMMETRICAL JUNCTIONS

(75) Inventor: Moon Sik Suh, Yongin (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 38 days.

(21) Appl. No.: 11/166,482

(22) Filed: Jun. 24, 2005

(65) Prior Publication Data
US 2006/0205162 A1 Sep. 14, 2006

(30) Foreign Application Priority Data
Mar. 14, 2005 (KR) .................... 10-2005-0020926

(51) Int. Cl.
*H01L 21/8234* (2006.01)
(52) U.S. Cl. .............. 438/238; 257/E21.507; 257/E21.166; 257/E21.548
(58) Field of Classification Search ........ 257/E21.507, 257/E21.166, E21.548; 438/232, 231, 238
See application file for complete search history.

(56) References Cited

U.S. PATENT DOCUMENTS

| 5,386,382 A | * | 1/1995 | Ahn ............... 365/174 |
| 5,675,159 A | | 10/1997 | Oku et al. ........... 257/284 |
| 6,040,210 A | * | 3/2000 | Burns et al. .......... 438/238 |
| 6,078,071 A | * | 6/2000 | Matsuda ............ 257/280 |
| 6,368,915 B1 | | 4/2002 | Montree et al. ........ 438/257 |
| 6,653,181 B2 | | 11/2003 | Hergenrother et al. ..... 438/206 |
| 6,878,646 B1 | * | 4/2005 | Tsai et al. ............ 438/756 |
| 7,049,196 B2 | * | 5/2006 | Noble ............... 438/268 |
| 7,098,497 B2 | * | 8/2006 | Fukuzumi ............ 257/296 |
| 2003/0040144 A1 | * | 2/2003 | Blanchard et al. ........ 438/145 |
| 2004/0082133 A1 | | 4/2004 | Salling et al. .......... 438/301 |
| 2005/0173744 A1 | * | 8/2005 | Kim et al. ........... 257/296 |
| 2005/0179073 A1 | * | 8/2005 | Lee et al. ............ 257/296 |

FOREIGN PATENT DOCUMENTS

| JP | 08-264788 | 10/1996 |
| JP | 2001-210822 | 8/2001 |
| KR | 1020040108247 A | 12/2004 |
| KR | 2005-0004352 | 1/2005 |
| KR | 1020050122476 A | 12/2005 |
| KR | 1020060075079 A | 7/2006 |

* cited by examiner

*Primary Examiner*—Michael S. Lebentritt
*Assistant Examiner*—Thu-Huong Dinh
(74) *Attorney, Agent, or Firm*—Marshall, Gerstein & Borun LLP

(57) ABSTRACT

Disclosed is a method for manufacturing a semiconductor device having recess channels and asymmetrical junctions. The method includes forming an impurity region for adjusting the threshold voltage by implanting ions into a bit line junction of a semiconductor substrate, which includes storage nodes junction, the bit line junction, and channel regions between the source and bit line junctions, and portions of the channel regions of the semiconductor substrate adjacent to the bit line junction; forming recess channel trenches by etching the channel regions of the semiconductor substrate to a designated depth; forming a gate stack on the semiconductor substrate provided with the recess channel trenches; and forming the storage nodes junction and the bit line junction on the semiconductor substrate provided with the gate stack via ion implantation.

14 Claims, 5 Drawing Sheets

METHOD FOR MANUFACTURING SEMICONDUCTOR DEVICE WITH RECESS CHANNELS AND ASYMMETRICAL JUNCTIONS

BACKGROUND OF THE INVENTION

1. Field of the Invention

The present invention relates to a method for manufacturing a semiconductor device, and more particularly to a method for manufacturing a semiconductor device having recess channels and asymmetrical junctions.

2. Description of the Related Art

As the integration of semiconductor devices increase, deterioration in the characteristics of semiconductor devices due to short channel effects is of primary concern. Further, in a process for forming a shallow trench isolation (STI) film, an inverse narrow width effect (INWE) due to the edges of an active region is increased. Accordingly, leakage current characteristics are generated in transistors, thereby causing the deterioration in the characteristics of the semiconductor device, for example, deterioration in the refresh or data retention time of a dynamic random access memory (DRAM). Thus, a semiconductor device having recess channels with an increased length without increasing the density of the dopant on a semiconductor substrate has been proposed. In a method for manufacturing the semiconductor device having the recess channels, channel regions of the semiconductor substrate are recessed to a designated depth and a stack is formed on the recessed channel regions, thereby increasing the length of the channels in a vertical direction. That is, since the effective channel length is increased in proportion to the recessed length of the channel regions of the semiconductor substrate, it is possible to assure the margin of a short channel without increasing the density of the dopant in the channel regions, thereby preventing the deterioration in the refresh characteristics of the DRAM.

In a semiconductor device, particularly a DRAM, storage nodes junction and a bit line junction are electrically connected to storage nodes of a capacitor and the bit line respectively. Leakage current in the storage nodes junction connected to the storage nodes of the capacitor deteriorates the refresh characteristics of the DRAM. Recently, p-type impurity ions for adjusting the threshold voltage, for example, B ions or $BF_2$ ions are implanted into the semiconductor substrate under the condition that the storage nodes junction are cut off, thereby increasing the width of the depletion region in storage node or source junction only, thus decreasing an electric field in the storage noce or source junction only and decreasing the amount of leakage current. Accordingly, a semiconductor device employing the above asymmetrical junctions has been proposed.

FIGS. 1A and 1B are sectional views illustrating one conventional method for manufacturing a semiconductor device having asymmetrical junctions.

First, with reference to FIG. 1A, a mask film pattern 12 for adjusting the threshold voltage and forming asymmetrical junctions is formed on a semiconductor substrate 10, an active region of which is restricted by shallow trench isolation (STI) films 11. The mask film pattern 12 includes an opening 12' for exposing portions of the semiconductor substrate 10 other than portions of an active region of the semiconductor substrate 10 connected to the storage nodes. Then, as shown by the arrow in FIG. 1A, an impurity region 13 for adjusting the threshold voltage is formed by an ion implantation process using the mask film pattern 12 as an ion implantation mask.

Thereafter, as shown in FIG. 1B, after the mask film pattern (12 in FIG. 1A) is eliminated, a gate stack 14 is formed on the semiconductor substrate 10 using conventional methods. The gate stack 14 is a stacked sequentially structured including a gate insulating film pattern 14a, a gate conductive film pattern 14b, a metal silicide film pattern 14c, and an insulating capping layer pattern 14d. Then, although not shown in the drawings, an ion implantation process and an impurity diffusion process for forming source and bit line junctions are performed. When the source and bit line junctions are formed through the ion implantation process and the impurity diffusion process, an impurity region 13 for adjusting the threshold voltage is partially formed on the semiconductor substrate 10, thereby forming the source and bit line junctions having asymmetrical junctions.

In the above conventional method, the position of the impurity region 13 for adjusting the threshold voltage is changed by the misalignment of the mask film pattern (12 in FIG. 1A). The change in position of the impurity region 13 is undesirable, and causes the threshold voltages of transistors not to be uniformly maintained. That is, a left-biased impurity region 13a generated by misalignment of the mask film pattern (12 in FIG. 1A) causes the threshold voltage of a right transistor (B) to be lower than the threshold voltage of a left transistor (A). On the other hand, a right-biased impurity region 13b generated by the misalignment of the mask film pattern (12 in FIG. 1A) causes the threshold voltage of the left transistor (A) to be lower than the threshold voltage of the right transistor (B).

FIG. 2 is a sectional view illustrating another conventional method for manufacturing a semiconductor device having asymmetrical junctions.

The conventional method as shown in FIG. 2 is the same as that as shown in FIGS. 1A and 1B. However, in the conventional method of FIG. 2, impurity ions for adjusting threshold voltage are implanted onto the overall surface of the semiconductor substrate 10 without using a separate mask film pattern. Then, after the gate stack 14 is formed on the semiconductor substrate 10, a mask film pattern 15 for exposing a portion of the semiconductor substrate 10 exposed by the gate stack 14 is formed. Here, the exposed portion of the semiconductor substrate 10 is not connected to a storage node, but is connected to a bit line. An additional ion implantation process is performed using the mask film pattern 15 as an ion implantation mask film. Then, after the mask film pattern 15 is eliminated, an impurity ion implantation and diffusion process forming source and bit line junctions is performed.

In this case, as the integration of semiconductor devices is increased, an interval between the semiconductor devices is narrowed, thereby causing difficulty of definately defining a mask film pattern for ion implantation due to the scum on a mask film such as a photosensitive film.

SUMMARY OF THE INVENTION

Therefore, the present invention has been made in view of the above problems, and it is an object of the present invention to provide a method for manufacturing a semiconductor device having recess channels and asymmetrical junctions, which prevents problems due to the misalignment of a mask film pattern and difficulty in defining the mask film pattern while not deteriorating the uniformity of threshold voltages between neighboring transistors.

In accordance with the present invention, the above and other objects can be accomplished by the provision of a method for manufacturing a semiconductor device having recess channels and asymmetrical junctions comprising: forming an impurity region for adjusting the threshold voltage by implanting ions into a bit line junction of a semiconductor substrate, which includes storage nodes junction, the bit line junction, and channel regions between the source and bit line junctions, and portions of the channel regions of the semiconductor substrate adjacent to the bit line junction; forming recess channel trenches by etching the channel regions of the semiconductor substrate to a designated depth; forming a gate stack on the semiconductor substrate provided with the recess channel trenches; and forming the storage nodes junction and the bit line junction on the semiconductor substrate provided with the gate stack via ion implantation.

Preferably, the formation of the recess channel trenches may be performed such that the depth of the recess channel trenches is larger than that of the impurity region.

The impurity region may have a depth of 50 angstroms (Å) to 2,500 Å from the surface of the semiconductor substrate. Further, the recess channel trenches may have a depth of 50 Å to 2,500 Å from the surface of the semiconductor substrate.

Preferably, the formation of the impurity region may be performed by implanting p-type impurity ions into the semiconductor substrate. In this case, the p-type impurity ions may be one selected from the group consisting of B ions, $BF_2$ ions, and Indium ions.

The width of a mask film pattern for forming the impurity region may be in the range of one to three times of the feature size. The width of a mask film pattern for forming the impurity region may be in the range of one to three times of the width of a gate mask film pattern forming gates.

The method may further include implanting n-type impurity ions after the formation of the impurity region. In this case, the n-type impurity ions may be one selected from the group consisting of P ions and As ions. Preferably, the n-type impurity ions may be implanted such that the n-type impurity ions are disposed on the surface of the impurity region.

BRIEF DESCRIPTION OF THE DRAWINGS

The present invention will be more clearly understood from the following detailed description taken in conjunction with the accompanying drawings, in which.

DESCRIPTION OF THE PREFERRED EMBODIMENTS

Figure 1A:
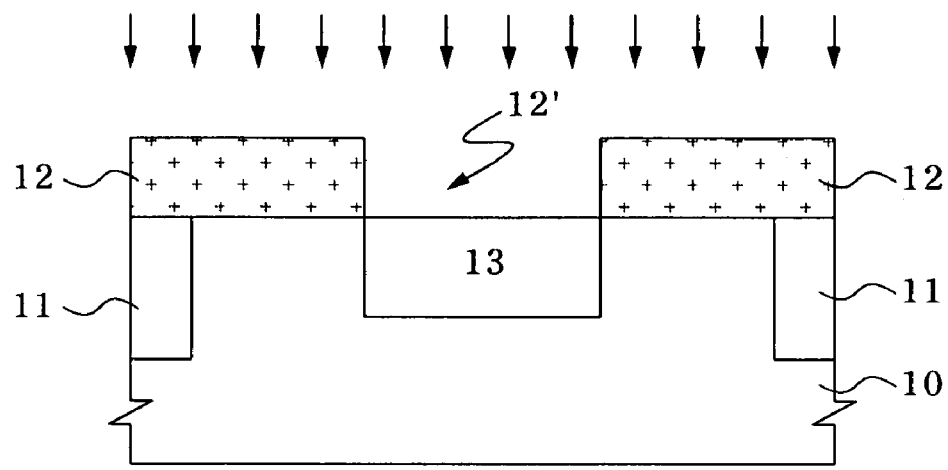
FIGS. 1A and 1B are sectional views illustrating one conventional method for manufacturing a semiconductor device having asymmetrical junctions.
Figure 1B:
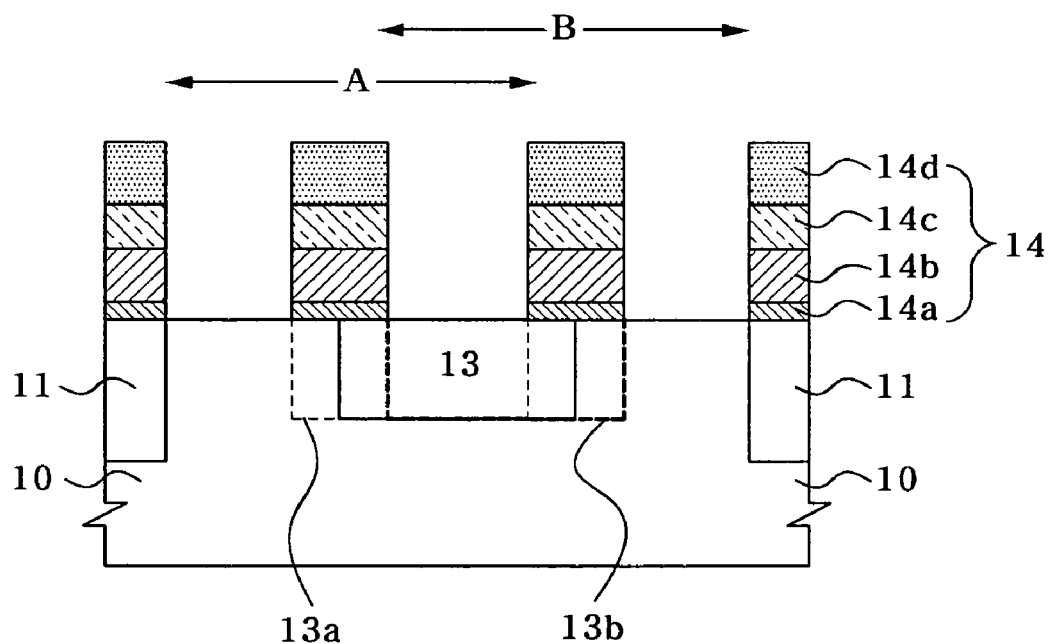
Figure 2:
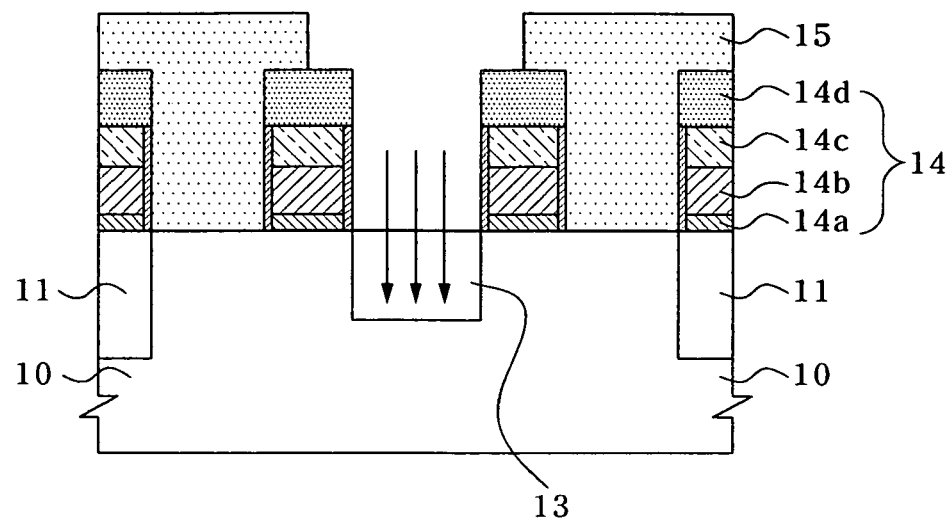
FIG. 2 is a sectional view illustrating another conventional method for manufacturing a semiconductor device having asymmetrical junctions.

Now, preferred embodiments of the present invention will be described in detail with reference to the drawings. The present invention is not limited by the embodiments, but may be variously modified. The drawings are enlarged to clearly illustrate various layers and regions. Throughout the specification, the same or similar elements are denoted by the same reference numerals even though they are depicted in different drawings.

FIGS. 3 to 9 are sectional views illustrating a method for manufacturing a semiconductor device having recess channels and asymmetrical junctions in accordance with one embodiment of the present invention.

Figure 3:
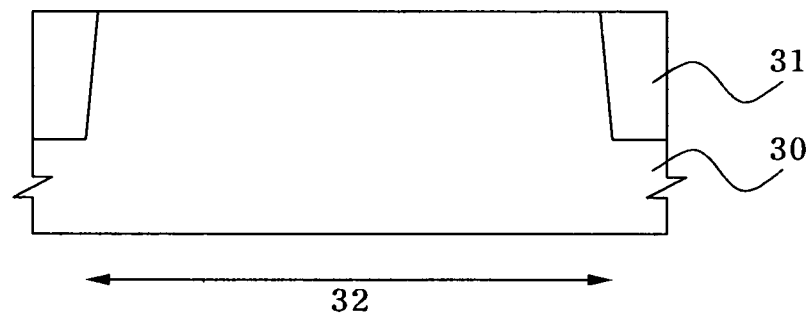
FIGS. 3 to 9 are sectional views illustrating a method for manufacturing a semiconductor device having recess channels and asymmetrical junctions in accordance with one embodiment of the present invention.

First, as shown in FIG. 3, a conventional STI process is performed, thereby forming trench isolation films 31 in a semiconductor substrate 30. The trench isolation films 31 serve to define an active region 32 in the semiconductor substrate 30. Then, p-type impurity ions are implanted into the active region 32 between the trench isolation films 31 of the semiconductor substrate 30, thereby forming a well region (not shown). In some cases, the ion implantation for forming the well region may be omitted.

Figure 4:
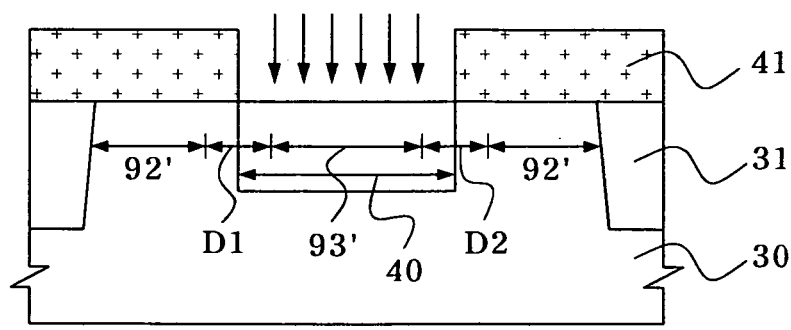

Thereafter, as shown in FIG. 4, a mask film, such as a photosensitive film, is applied to the semiconductor substrate 30, and a photo-etching process is performed, thereby forming a mask film pattern 41 defining an impurity region 40 for adjusting the threshold voltage. The impurity region 40 is formed by an ion implantation process using the mask film pattern 41 as an ion implantation mask film. Here, the implanted ions are p-type impurity ions, for example, B ions, $BF_2$ ions, or I ions. Ion implantation energy is properly adjusted so that the impurity region 40 has a depth of approximately 50 Å to 2,500 Å from the surface of the semiconductor substrate 30.

Figure 11:
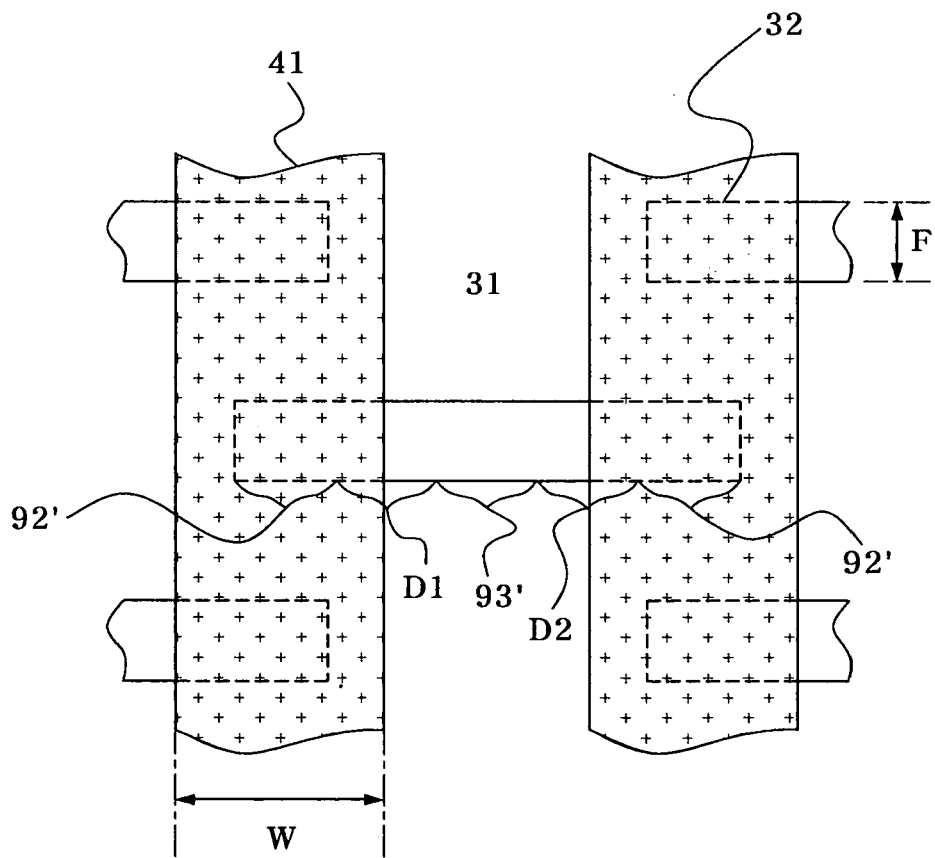
FIG. 11 is a layout view illustrating a mask film pattern used in the method of the present invention.

The mask film pattern 41, as shown in FIG. 11, completely covers the first regions 92' of the active region 32, in which storage nodes junction will be formed, but completely exposes a second region 93' of the active region 32, in which a bit line junction will be formed. Further, the mark film pattern 41 exposes only portions of third regions D1 and D2 between the first regions 92' and the second region 93', in which channel regions will be formed, adjacent to the second region 93'. The impurity region 40 defined by the mask film pattern 41 is formed in the second region 93' and the portions of the third regions D1 and D2 adjacent to the second region 93' such that the impurity region 40 has a designated depth. The width (W) of the mask film pattern 41 is one to three times of the feature size (F). That is, the width (W) of the mask film pattern 41 is in the range one to three times of the width of a gate, which will be formed in a subsequent step.

Figure 5:
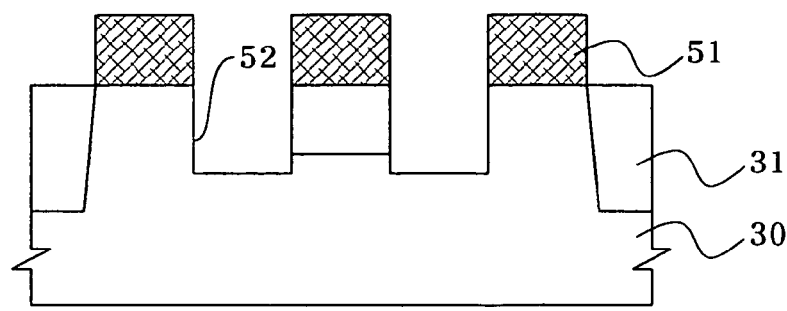

Thereafter, as shown in FIG. 5, after the mask film pattern 41 is eliminated, a mask film pattern 51, for example, using a photosensitive film, for exposing regions, in which recess channel trenches 52 of the semiconductor substrate 30 will be formed, is formed on the semiconductor substrate 30. Then, exposed portions of the semiconductor substrate 30 are eliminated to a designated depth by an etching process using the mask film pattern 51 as an etching mask. The depth (d) of the recess channel trenches 52 obtained by the above etching process is larger than that of the impurity region 40. Preferably, the depth (d) of the recess channel trenches 52 is approximately 50 Å to 2,500 Å. The reason that the depth (d) of the recess channel trenches 52 obtained by the above etching process is larger than that of the impurity region 40 is that the change in the position of the impurity region 40 to left or right due to the misalignment of the mask film pattern (41 in FIG. 4) does not affect the uniformity of the threshold voltage of the device. Now, this will be described in more detail.

As shown in FIG. 5, even if the impurity region 40 is biased to the left due to the misalignment of the mask film pattern (41 in FIG. 4), a difference of the density of impurities between the channel portions surrounding the recess channel trenches 52 of neighboring transistors is not generated. In the case that the depth (d) of the recess channel trenches 52 is smaller than the impurity region 40 and the bottoms of the recess channel trenches 52 are surrounded by the impurity region 40, a difference of threshold voltages between channel regions of neighboring transistors, particularly, between the bottoms of the recess channel trenches 52, may be generated due to the movement of the position of the impurity region 40. However, in the present invention, since the bottoms of the recess channel trenches 52 are not related to the impurity region 40, the above difference in threshold voltages due to the misalignment of the mask film pattern is not generated.

Figure 6:
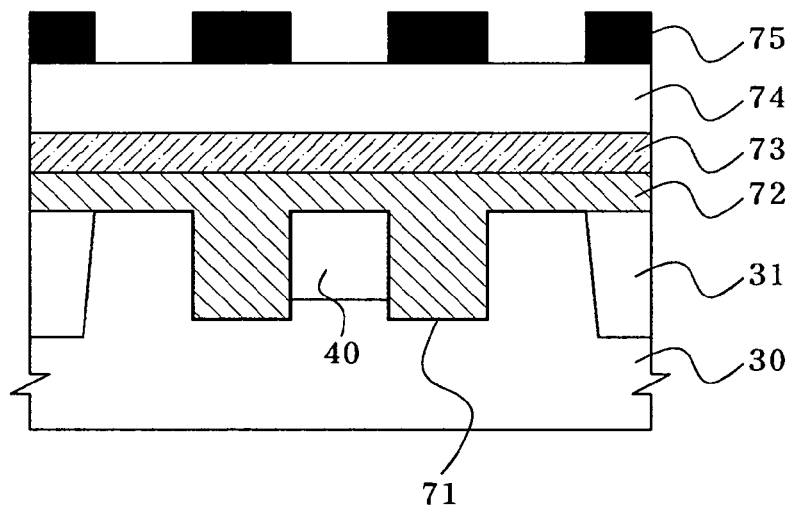

With reference to FIG. 6, a gate insulating film 71 is formed on the overall surface of the semiconductor substrate 30, in which the recess channel trenches 52 are formed. The gate insulating film 71 is made of an oxidation film. Then, a gate conductive film 72, a metal silicide film 73, and an insulating capping film 74 are sequentially stacked on the gate insulating film 71. The gate conductive film 72 is made of a polysilicon film. The metal silicide film 73 is made of a tungsten silicide film. The insulating capping film 74 is made of a nitride film. Thereafter, a photosensitive film is applied to the insulating capping film 74, and a mask film pattern 75 for forming a gate stack is obtained by exposing the photosensitive film to light and developing the photosensitive film.

Figure 7:
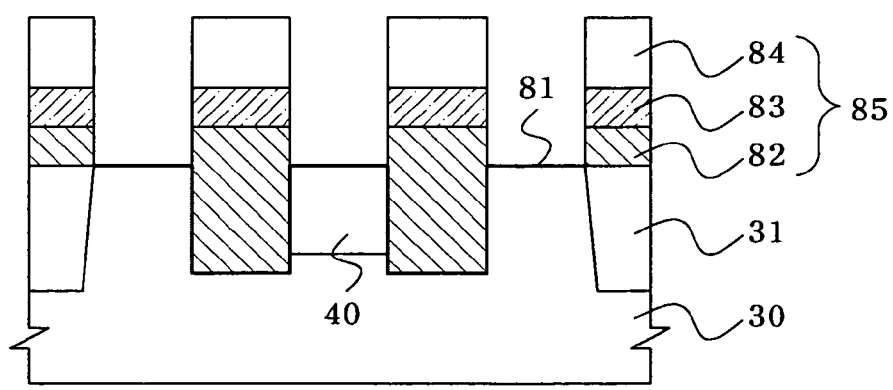

As shown in FIG. 7, exposed portions of the insulating capping film 74, the metal silicide film 73, the gate conductive film 72, and the gate insulating film 71 are sequentially etched using the mask film pattern 75. Thereby, a gate stack 85, in which a gate insulating film pattern 81, a gate conductive film pattern 82, a metal silicide film pattern 83, and an insulating capping film pattern 84 are sequentially stacked, is obtained. Then, the mask film pattern 75 is eliminated.

Figure 8:
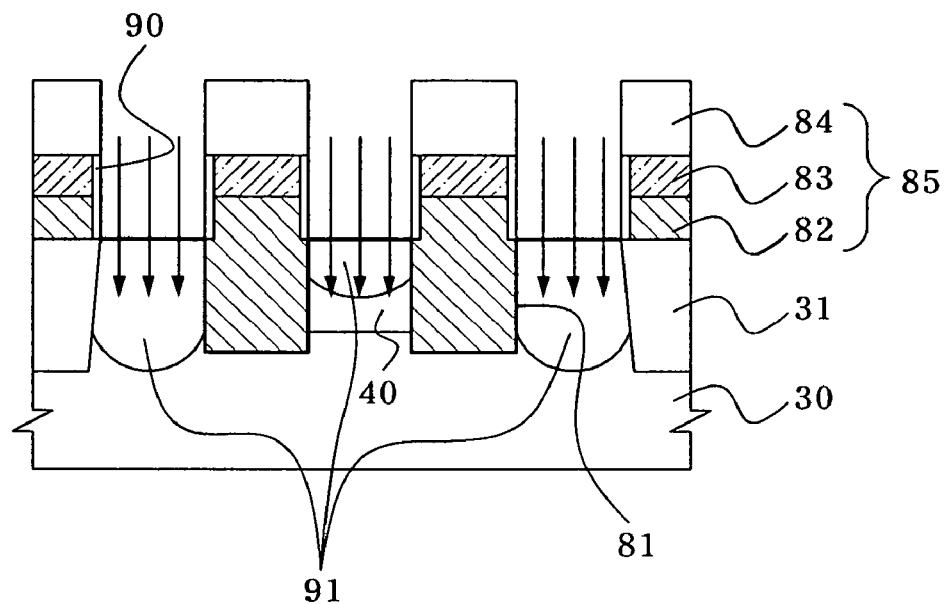

Thereafter, as shown in FIG. 8, side walls of the metal silicide film pattern 83 and the gate conductive film pattern 82 are oxidized, thereby producing oxidation films 90, for example, gate poly oxidation films. The oxidation films 90 serve to protect the gate stack 81 from an etching solution when wet etching is performed later, and to prevent a spacer insulating film, which will be formed later, from being lifted from the gate conductive film pattern 82. Then, n-type impurity ions are implanted into the lower portion of the semiconductor substrate 30 provided with the gate stack 81. Thus, since p-type impurity ions are implanted into a bit line junction, and are not implanted into storage nodes junction, source/drain junctions 91 having an asymmetrical depth are formed.

Figure 9:
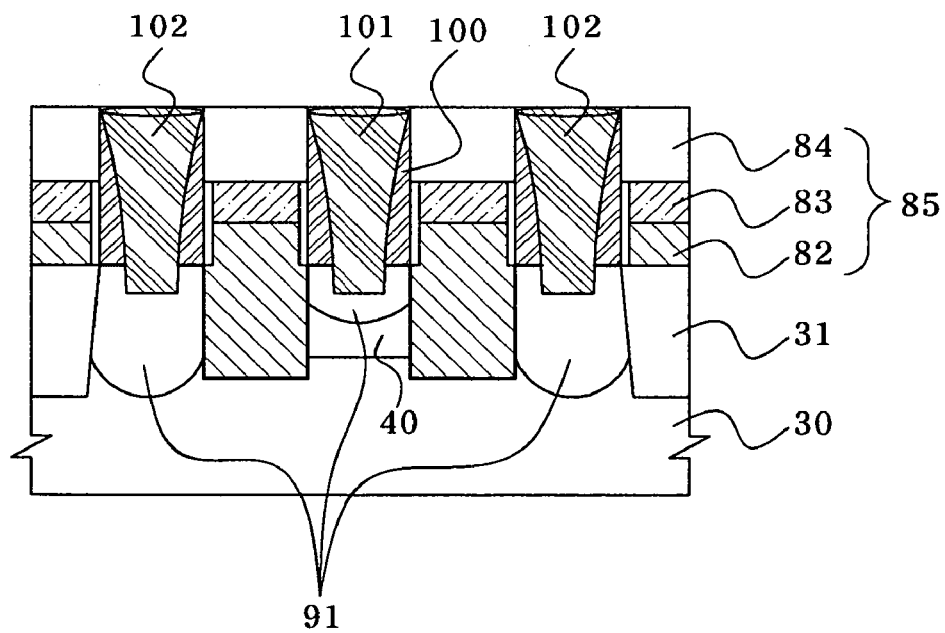

Thereafter, as shown in FIG. 9, after a nitride film (not shown) is deposited on the overall surface of a structure including the gate stack 85, an anisotropic etching process is additionally performed, thereby forming a spacer insulating film 100. Grooves are formed by etching portions of the semiconductor substrate 30 exposed by the spacer insulating film 100 to a small depth, and are capped with a doped polysilicon film. Then, the surfaces of the grooves are leveled through chemical mechanical polishing. Thereby, a bit line contact pad 101 and storage node contact pads 102 are formed.

Figure 10:
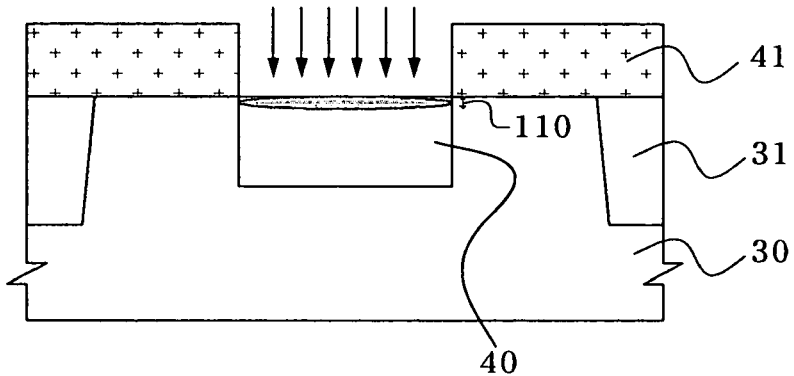
FIG. 10 is a sectional view illustrating a method for manufacturing a semiconductor device having recess channels and asymmetrical junctions in accordance with another embodiment of the present invention.

FIG. 10 is a sectional view illustrating a method for manufacturing a semiconductor device having recess channels and asymmetrical junctions in accordance with another embodiment of the present invention.

First, through steps the same as those as shown in FIGS. 3 and 4, trench isolation films 31 are formed in a semiconductor substrate 30, and a well region (not shown) is formed in the semiconductor substrate 30 between the trench isolation films 31. Then, a mask film pattern 41 defining an impurity region 40 for adjusting the threshold voltage is formed on the semiconductor substrate 30 by applying a photosensitive film and performing a photo-etching process. Thereafter, the impurity region 40 for adjusting the threshold voltage is formed by performing an ion implantation process using the mask film pattern 41 as an ion implantation mask film.

As shown in FIG. 10, implantation of impurities into the surface 110 of the semiconductor substrate 30 in the impurity region 40 for adjusting the threshold voltage is added. Here, the impurities implanted into the surface 110 of the semiconductor substrate 30 are n-type impurity ions, such as P ions and As or Arsenic ions. The implantation of the n-type impurity ions into the surface 110 of the semiconductor substrate 30 prevents the increase in resistance at an interface between the impurity region 40 and other region of the semiconductor substrate 30. Thereafter, other steps of this embodiment are the same as those as shown in FIGS. 5 to 10.

As apparent from the above description, the present invention provides a method for manufacturing a semiconductor device having recess channels and asymmetrical junctions, in which ions for adjusting threshold voltage are implanted only into a region of the semiconductor substrate except for the storage node contact pad portions, and gate regions are recessed so that the impurities remain only on the bit line contact pad region, thereby maintaining the uniformity of the threshold voltage of the device even when misalignment of a mask film pattern is generated.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A method for manufacturing a semiconductor device having recess channels and asymmetrical junctions, the method comprising:
(a) providing a semiconductor substrate comprising laterally located regions for storage node junctions, and a bit line junction, and channel regions disposed laterally between the storage node junctions and the bit line junction;
(b) first implanting p-type ions into the region of the bit line junction and the channel regions to form an impurity region having a depth, and two side parts by using a mask film pattern having a width of one to three times of a feature size;
(c) forming recess channel trenches in the substrate by etching the channel regions to a designated depth, the depth of the recess channel trenches being greater than the depth of the impurity region, so that the recess channel trenches cut out both side parts of the impurity region to confine a width of the impurity region to a reduced width region between the trenches;

(d) forming gate stacks filling the recess channel trenches; and (e) second implanting n-type ions into the confined impurity region and the regions of the storage node junctions by using the gate stacks as an implanting mask, to form asymmetric junctions such that the bit line junction is formed as a more shallow junction than the storage node junctions due to the confined impurity region.

2. The method according to claim 1, wherein the impurity region has a depth of 50 angstroms (Å) to 2,500 Å from the surface of the semiconductor substrate.

3. The method according to claim 1, wherein the recess channel trenches have a depth of 50 Å to 2,500 Å from the surface of the semiconductor substrate.

4. The method according to claim 1, wherein the p-type impurity ions are ones selected from the group consisting of B ions, $BF_2$ ions, and I ions.

5. The method according to claim 1, wherein the width of a mask film pattern for forming the impurity region is in a range of one to three times of the width of a gate mask film pattern forming gates.

6. The method according to claim 1, wherein the n-type impurity ions are selected from the group consisting of P ions and As ions.

7. The method according to claim 1, wherein the n-type impurity ions are implanted such that the n-type impurity ions are disposed on the surface of the impurity region.

8. A method for manufacturing a semiconductor device having recess channels and asymmetrical junctions, the method comprising:

(a) providing a semiconductor substrate comprising laterally located regions for storage node junctions and a bit line junction, and channel regions disposed laterally between the storage node junctions and the bit line junction;

(b) first implanting p-type ions into the region of the bit line junction and the channel regions to form an impurity region;

(c) forming recess channel trenches in the substrate by etching the channel regions to a designated depth so that the recess channel trenches cut out both side parts of the impurity region to confine a width of the impurity region to a reduced width region between the trenches, (d) forming gate stacks filling the recess channel trenches; and (e) second implanting n-type ions into the confined impurity region and the regions of the storage node to form junctions to form asymmetric junctions such that the bit line junction is formed as a more shallow junction than the storage node junctions due to the confined impurity region.

9. The method according to claim 8, wherein the impurity region has a depth of 50 angstroms (Å) to 2,500 Å from the surface of the semiconductor substrate.

10. The method according to claim 8, wherein the recess channel trenches have a depth of 50 Å to 2,500 Å from the surface of the semiconductor substrate.

11. The method according to claim 8, wherein the p-type impurity ions are ones selected from the group consisting of B ions, $BF_2$ ions, and I ions.

12. The method according to claim 8, wherein the width of a mask film pattern for forming the impurity region is in a range of one to three times of the width of a gate mask film pattern forming gates.

13. The method according to claim 8, wherein the n-type impurity ions are selected from the group consisting of P ions and As ions.

14. The method according to claim 8, wherein the n-type impurity ions are implanted such that the n-type impurity ions are disposed on the surface of the impurity region.

* * * * *